United States Patent
Sinanoglu

(10) Patent No.: US 9,170,298 B2
(45) Date of Patent: Oct. 27, 2015

(54) SYSTEM, METHOD AND COMPUTER-ACCESSIBLE MEDIUM FOR DESIGN FOR TESTABILITY SUPPORT FOR LAUNCH AND CAPTURE OF POWER REDUCTION IN LAUNCH-OFF-CAPTURE TESTING

(71) Applicant: New York University, New York, NY (US)

(72) Inventor: Ozgur Sinanoglu, Abu Dhabi (AE)

(73) Assignee: New York University, New York, NY (US)

(*) Notice: Subject to any disclaimer, the term of this patent is extended or adjusted under 35 U.S.C. 154(b) by 97 days.

(21) Appl. No.: 13/903,213

(22) Filed: May 28, 2013

(65) Prior Publication Data
US 2013/0318414 A1   Nov. 28, 2013

Related U.S. Application Data

(60) Provisional application No. 61/651,912, filed on May 25, 2012.

(51) Int. Cl.
*G01R 31/3177* (2006.01)
*G01R 31/3185* (2006.01)

(52) U.S. Cl.
CPC .... *G01R 31/3177* (2013.01); *G01R 31/318572* (2013.01)

(58) Field of Classification Search
CPC .................................................. G01R 31/318536
USPC ........................................ 714/726, 729, 731
See application file for complete search history.

(56) References Cited

U.S. PATENT DOCUMENTS 7,447,961 B2 *  11/2008  Tan ............................... 714/726
7,613,967 B1 *  11/2009  Tan ............................... 714/726

* cited by examiner

*Primary Examiner* — Fritz Alphonse
(74) *Attorney, Agent, or Firm* — Andrews Kurth LLP

(57) ABSTRACT

Exemplary system, method and computer accessible medium that can transform a circuit by selecting at least one scan cell as an interface register and inserting a shadow register into each interface register. Operations can be shifted to load and unload at least one scan cell in the circuit. An operation can be launched in at least one of the interface registers and in a first set of scan cells. A capture operation can be performed in a second set of scan cells. An operation can be restored in at least one interface register by transferring data from at least one shadow register.

20 Claims, 4 Drawing Sheets

SYSTEM, METHOD AND COMPUTER-ACCESSIBLE MEDIUM FOR DESIGN FOR TESTABILITY SUPPORT FOR LAUNCH AND CAPTURE OF POWER REDUCTION IN LAUNCH-OFF-CAPTURE TESTING

CROSS-REFERENCE TO RELATED APPLICATIONS

This application relates to and claims priority from U.S. Patent Application No. 61/651,912, filed on May 25, 2013, the entire disclosure of which is incorporated herein by reference.

FIELD OF THE DISCLOSURE

The present disclosure relates generally to the testing of integrated circuits, and more specifically, relates to exemplary embodiments of a system, method and computer accessible medium for launch and capture power reduction in launch-off-capture ("LOC") testing.

BACKGROUND INFORMATION

Timing-related defects in Very Large Scale Integrated ("VLSI") circuits have been a reliability concern with smaller feature sizes and the resulting deep sub-micron effects. Consequently, at-speed testing approaches have been employed, with the test designed to screen out performance-related failures. The manual generation of functional patterns, however, can generally be hampered by the design complexity, which can mandate automatic test pattern generation enabled by structural scan-based testing methods.

Scan-based at-speed testing can utilize load, launch and capture operations for every test pattern. Load operations can be performed via scan/shift operations, filling up all the scan chains with the pattern. As the targeted defects can be timing related, these patterns can check whether transitions launched from scan cells can arrive at their destinations (e.g., scan cells) within a functional clock period.

Currently, there are two different procedures for launching transitions off the serially loaded pattern. As shown in FIG. 1, in LOC, or broadside test 105 (see, e.g., Reference 1), a functional capture operation can launch transitions from the locations where the serially loaded pattern (V1) can differ from the response of the combinational logic to (V1), for example, the launch pattern (V2). In launch-off-shift ("LOS" or skewed-load) test 110 (see, e.g., Reference 2), a single-cycle shift operation can launch transitions from the locations where the serially loaded pattern (V1) can differ from its one-bit shifted version, for example, the launch pattern (V2). In both procedures, a subsequent fast functional capture operation, which can be of a functional clock period apart from the launch event, can set a deadline for the transitions to arrive at their destinations; a timing related defect that slows down the chip below its rated clock speed can thus be exposed.).

Serial shift operations during scan can result in excessive switching activity in the scan chains, which can propagate into the combinational logic, dissipating further dynamic power unnecessarily in both static and at-speed testing procedures. This can result in an unexpected behavior of the design, which can result in a yield loss, or reliability problems. Elevated levels of peak power, which can be the maximum instantaneous power throughout the entire test process, can be the cause of the former problem, while the underlying reason for the latter problem can be the average power that can be the total power dissipation averaged over the duration of the test application process. (See, e.g., References 3 and 4). As the test application process can be dominated by shift operations, average power can mostly depend on shift power, and thus, the impact of launch/capture power on average power can be negligible. Launch/capture power can be more of a concern when peak power can be the targeted issue.

A yield loss problem can be further exacerbated in at-speed testing procedures. (See, e.g., References 5 and 6). Excessive switching activity during the launch cycle can result in elevated peak supply currents, which can lead to an IR drop that can increase the signal propagation delays in the combinational logic. The end-effect cannot be differentiated from that of a timing-related defect, causing a functional chip to fail the at-speed test. A peak power, during the launch cycle of at-speed testing, can therefore be reduced in order to avoid the yield loss induced by IR drop.

A significant amount of research has been done to try to reduce power dissipation during the launch and capture of at-speed testing. Test pattern generation can be done in order to produce patterns that can disable parts of the design during launch and capture (see, e.g., References 7 and 8), and to reduce peak power at the expense of pattern count inflation. Another approach that can elevate pattern count while reducing peak launch power can be in the form of generating patterns under the constraint that only one chain can launch transitions while all chains can capture. (See, e.g., Reference 9). A partitioning approach can be used (see, e.g., Reference 10), whereby power wise costly patterns can be further analyzed via fault simulation to identify the location of the care bits, which can dictate the partitioning of the design during capture. With few problematic patterns, such an approach can deliver power saving albeit at the expense of ancillary defect coverage loss, as the analysis can be fault model dependent.

A judicious x-fill approach driven by an analysis of the responses repetitively produced by the combinational logic can be used. (See, e.g., Reference 11). As with other x-fill approaches, pattern count inflation can be the side effect. Another x-fill approach (see, e.g., Reference 12) can retain pattern count and fault coverage, while it cannot guarantee the same level of defect coverage. Partitioning the design, and testing one partition at a time has been proposed to reduce launch and capture power in a Built-In-Self-Test ("BIST") (see, e.g., Reference 13), in LOS (see, e.g., Reference 14), and in LOC (see, e.g., Reference 15) testing procedures. In both procedures, newly generated patterns targeting one partition at a time end up loading the interface registers of other partitions as well, incurring a test time and data volume penalty. A similar end-result can be experienced even when the design can be partitioned via Integer Linear Programming ("ILP"), which can minimize capture violations. (See, e.g., Reference 16). For such violations, additional test patterns, such as those having of a high sequential depth, can be generated in order to cover the faults missed due to capture violations, while leaving some of the un-modeled defects uncovered.

Thus, it may be beneficial to provide an exemplary design for testing ("DfT") solution, which can reduce launch and capture power in LOC, and which can overcome at least some of the deficiencies described herein above.

SUMMARY OF EXEMPLARY EMBODIMENTS

Thus, to address at least some of the deficiencies and/or issues described herein above, it can be beneficial to provide exemplary embodiments of a system, method and computer accessible medium for launch and capture power reduction in LOC testing.

According to an exemplary embodiment of the present disclosure, a system, method and computer accessible medium can be provided for the LOC testing utilizing any given power-unaware procedure, that can be a cost and quality-wise optimized set of test patterns, while at the same time reducing launch and capture power. For example, as the transition launch mechanisms can be completely different in LOC and LOS testing, the exemplary DfT support to facilitate a design partitioning solution can be different as well. The exemplary system, method and computer accessible medium, for LOC testing can reduce the launch/capture power while retaining pattern count and test (e.g., fault and/or defect) quality intact. A timing-wise non-intrusive DfT support can be used to enable design partitioning that can result in low launch and capture power in LOC testing.

These and other objects, features and advantages of the present disclosure will become apparent upon reading the following detailed description of embodiments of the present disclosure, in conjunction with the appended claims.

BRIEF DESCRIPTION OF THE DRAWINGS

Further objects, features and advantages of the present disclosure will become apparent from the following detailed description taken in conjunction with the accompanying Figures showing illustrative embodiments of the present disclosure, in which.

Figure 1:
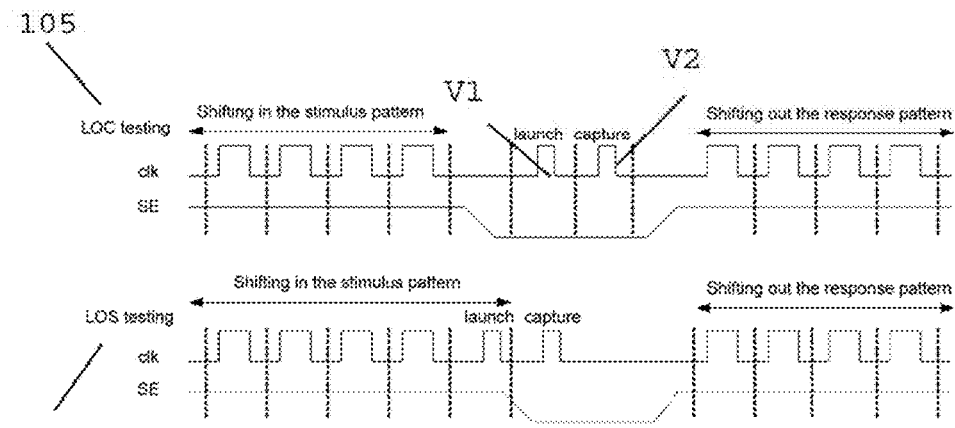
FIG. 1 is an exemplary graph of LOC and LOS testing procedures.

Throughout the drawings, the same reference numerals and characters, unless otherwise stated, are used to denote like features, elements, components, or portions of the illustrated embodiments. Moreover, while the present disclosure will now be described in detail with reference to the figures, it is done so in connection with the illustrative embodiments and is not limited by the particular embodiments illustrated in the figures.

DETAILED DESCRIPTION OF EXEMPLARY EMBODIMENTS

According to an exemplary embodiment of the present disclosure, a system, method and computer-accessible medium can be provided to facilitate a single-region-at-a-time testing of a design by utilizing any given set of test patterns. For example, upon the completion of the load of a pattern into the scan cells, launch and capture operations can be done in every region, one at a time, which can result in as many pairs of launch and capture pulses as the number of regions. A pattern can launch transition(s) from a set of flip-flops, which can span multiple regions, and can capture these transitions in the region(s) being tested. It can be challenging that, in any test pattern, there can be testing of any set of regions by launching transitions from any other set of regions. Testing one region at a time, in at-speed testing, can be done by launching and capturing transitions within one region at a time, delivering savings in launch and capture power. While in static testing, capture staggering opposite to the direction of data flow has been shown to facilitate the application of the test patterns to be intact. (See, e.g., Reference 18). The launch operation can impose additional constraints, and can utilize further DfT support in partition based at-speed testing.

In monolithic LOC testing, the flip-flops of the design can traverse three different states throughout the course of a test pattern application. Some or all of the registers can be loaded first (e.g., load state), then some or all of the registers can capture the response of the combinational logic (e.g., launch state), and some or all of the registers can launch a transition, and some or all of the registers can capture (e.g., capture state).

When a single region can be tested at a time, every time the registers of a region launch and capture, the load state in these registers can be lost. As some of these registers can launch transitions in subsequent testing of other regions, it can be preferable that their load state be restored prior to the test of these other regions. As an example, some of the registers in region A can feed some of the registers in region B as well as some of the registers in region C, and region C can be tested first. During the test of region, C, launch and capture operations may not only take place in this region, but also in the registers of A that can feed region C; transitions can potentially be launched from these registers of A as well. Furthermore, prior to the test of region B, which can be the next region to be tested, the registers of A can restore their load state back, as transitions can be launched from these registers again, this time for testing region B. Further, upon the test of region B, and prior to the test of region A, it can be preferable that all the registers in region A restore their load state, as these registers can launch transitions yet again, this time for the test of region A itself.

In the past, the approach taken in restoring the load state of registers can be to re-shift into them the same load data in between the launch/capture of every region. Such approach, however, can lead to a significant test time and data volume overhead. The exemplary system, method and computer accessible medium, according to an exemplary embodiment of the present disclosure, can utilize a DfT solution that does not impose any increase in test time and data volume. Additionally, for the example above, in circumstances where some of the registers in region A also feed some of the registers in region D, and the test of region A can be completed prior to the test of region D, restoring the load state in registers of A can cause the overwriting of the response information in these registers. In addition to the load state restoration capability, the order of testing the regions can be beneficial. In this example, region D can be tested prior to region A. To generalize, if a region feeds another region, the former region can be tested subsequent to the latter one. Therefore, the same constraint of "launch/capture order opposite in the direction of data flow" can apply to LOC testing as well. This may not be accomplished, however, if regions can form a cycle.

Using the exemplary system, method and computer accessible medium, according to an exemplary embodiment of the present disclosure, power savings during launch and capture in LOC testing via partitioning can be attained while also applying the patterns of a power-unaware Automatic Test Pattern Generation ("ATPG") tool if (a) acyclically formed regions can be tested in an order opposite to the data flow, and (b) region interface registers can be restored back to their load state upon launch and capture.

Exemplary Solution

To identify the exemplary design regions, and thus the scan cell groups properly, the exemplary s-graph of the design and/or procedure according to the exemplary embodiment of the present disclosure can be partitioned into Strongly-Connected-Components ("SCCs"). (See, e.g., Reference 18). An SCC can be a group of nodes where each node within the SCC can be reachable from each other in the SCC. An s-graph partitioned into SCCs can contain no cycles, delivering the acyclicity utilized. Multiple SCCs can form a region.

Figure 2:
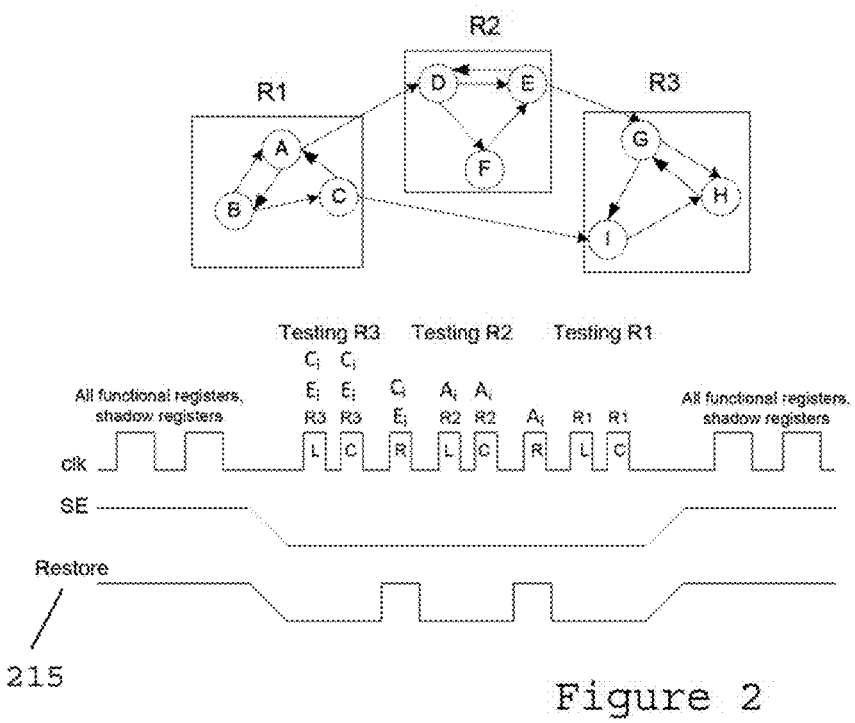
FIG. 2 is an exemplary diagram of an exemplary LOC test of one region at a time according to an exemplary embodiment of the present disclosure.

A diagram and a graph of exemplary region interaction is illustrated in FIG. 2, where region $R_1$, which can consist of three SCCs, can drive regions $R_2$ and $R_3$ (e.g., three SCCs each), and region $R_2$ can drive region $R_3$. In this case, region $R_3$ can be tested first. Launch and capture can also be performed in the registers of regions $R_1$ and $R_2$; however, only some of the registers in regions $R_1$ and $R_2$ can get involved, namely, the interface registers of $R_1$ and $R_2$. Interface registers of a region can be those that feed the registers of other regions through combinational paths. Launching and capturing in only the interface registers of a region in testing another region can facilitate a more cost-effective procedure, as the load state restore capability can be used for only the interface registers. In this example, upon the test of region $R_3$, the load state of only the interface registers of regions $R_1$ (e.g., some of the registers in C) and $R_2$ (e.g., some of the registers in E) can be restored. With the load state of regions $R_1$ and $R_2$ restored, the test of region $R_2$ can proceed. This time, launch and capture operations can be performed not only in region $R_2$, but also in the interface registers of $R_1$ (e.g., some of the registers in A) as well. Subsequently, the load state in the interface registers of $R_1$ can be restored, and the test of region $R_1$ can be conducted.

The block diagram and graph of FIG. 2 also illustrates that interface registers can likely only exist in SCCs A, C and E. In the exemplary timing diagram shown in FIG. 2, these interface registers can be denoted as $A_i$, $C_i$ and $E_i$, implying that these SCCs can also consist of non-interface registers. The clocking of test patterns provided in FIG. 2 illustrates that launch and capture operations can be performed in a small subset of the design registers at a time, which can result in both launch and capture power reductions. The diagram also shows the restore operations performed in the interface registers in between the test of regions (e.g., launch/capture pairs), with the help of a restore signal 215. Between the test of regions $R_3$ and $R_2$, the load state of the interface registers $C_i$ and $E_i$ can be restored, as $C_i$ and $E_i$ perform launch and capture operations to test $R_3$. In between the test of regions $R_2$ and $R_1$, however, only $A_i$ can be restored, as these registers can perform launch and capture for the test of region $R_2$.

The restore operation can utilize the storage of the load state of an interface register in a newly inserted test-only register denoted as shadow register. The bit stored in the shadow register can then be copied back into the interface register, once launch and capture operations have been completed in the interface register to test another region; mechanisms can be in place for the copy and restore operations. As with any DfT support, this capability can come at a cost. For example, the number of interface registers in a region that can be involved in testing a successor region can be minimized to reduce this cost.

Further reductions in launch and capture power can be attained by partitioning the registers into a larger number of regions during launch and capture. In such exemplary case, upon the test of every region except for the last one, a single-cycle restore operation can be conducted in the interface registers in which launch/capture operation can be performed to test another region. The capture window can be extended to accommodate for all the additional restore and launch-capture operations, which can result in a slight test time increase per pattern. The number of interface registers feeding a region along with the registers in that region can determine the reduction in launch and capture power, which can be for example:

$$Red_{LCpower} = \frac{\# \text{ scan cells}}{\max_{r \in regions} \{|r| + \sum_{p \in pred(r)} |p_i|\}}$$

where pred(r) can denote the set of regions that combinationally feed region r, $p_i$ can denote the number of interface registers in region p, and $Red_{LCpower}$ can denote the expected power reductions during launch and capture in LOC testing. The partitioning of the design can indicate the expected power reductions during launch and capture.

Exemplary DfT Support and Implementation

In order to be able to restore the load state (e.g., the bit shifted) of the interface (e.g., functional) register upon the launch and capture operations, one shadow (e.g., test) register can be inserted for each interface register. Throughout the shift operations, the shadow register can copy the content of the interface register, and during the capture window, the shadow register may not be clocked, ensuring that the copied value in the last shift cycle can be retained. Upon a launch and capture operation that the interface register can be involved in, its load state can be restored by copying the content of the shadow register back into the interface register.

Figure 3:
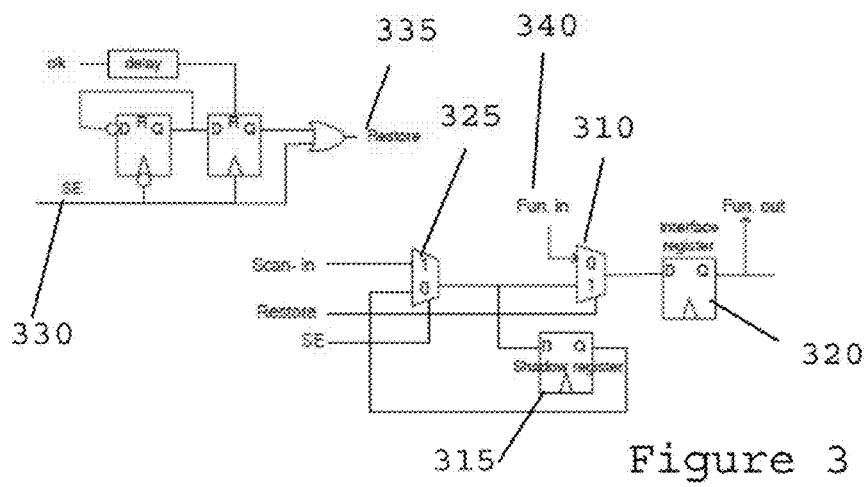
FIG. 3 is an exemplary circuit diagram of an exemplary DfT support for the load restore mechanism according to an exemplary embodiment of the present disclosure.

FIG. 3 shows a circuit diagram of an exemplary DfT support for the load state restore mechanism according to an exemplary embodiment of the present disclosure. A multiplexer 310 and a shadow flip-flop 315 can be inserted into the interface register 320, which can double the size of the interface scan cell. The newly inserted logic can fall on the test paths, and can incur no timing penalty. During the shift operations, the data that comes in from the scan-in pin 325 can be copied into both the shadow register 315 and the interface register 320. Once the scan load/unload operations have been completed, the scan-enable signal ("SE") 330 can be turned OFF, and the restore signal 335 can select between the functional input 340 (e.g., output of the combinational logic) and the shadow register 315 to load into the interface register. When the restore signal 335 can be low, the interface register 320 can perform launch and capture operations by latching the functional input. When the restore signal can be high, its load state can be recovered from the shadow register 315.

The restore signal can be easily generated on-chip by using a simple circuitry with only two flip-flops and an OR gate in total, as shown in FIG. 3, and can be turned ON subsequent to each launch-capture clock pulse pair in any region, which can be when the load state of interface registers can be restored. As there can be no timing requirement on the restore signal (e.g., the restore operation can be done any time after launch-capture), timing closure for this signal can utilize minimal effort. Furthermore, no additional pin can be utilized for this signal.

Exemplary Design Partitioning Procedure

With the exemplary system, method and computer accessible medium, according to an exemplary embodiment of the present disclosure, a partitioning procedure can be utilized for staggering launch-capture clocks of the regions. The same procedure can be utilized (see, e.g., Reference 17) to identify the interface registers in design partitioning based LOS testing. This exemplary partitioning procedure can be driven by a constraint, and two conflicting optimization criteria. The constraint can be that the regions should not form any cycle so that a launch-capture clock ordering in the opposite direction of the data flow can be pursued. The exemplary optimization criteria can be (a) minimization of launch and capture power, and (b) minimization of interface registers to minimize area cost.

The exemplary constraint can be met by identifying the strongly connected components of the s-graph of the design, in a manner similar to the low power static test approach (see, e.g., Reference 18). The resulting graph, where each SCC corresponds to a region, can be acyclic, enabling the levelization of the graph, and thus the identification of the region order that can be opposite to the direction of the data flow. A high-granularity design partitioning (e.g., a large number of regions) can deliver maximal savings in launch and capture power, as regions along with the interface registers that drive them can be small-sized. Conversely, the total number of interface registers can be excessive as there can be a large number of edges in the graph.

The two conflicting goals of minimizing launch-capture power and minimizing area cost can be handled through a procedure framework that can enable power-area co-optimizations. In an exemplary scenario, either maximum reduction in launch and capture power can be aimed under an area constraint, or a particular power reduction level can be targeted via minimal area cost.

Using the exemplary system, method and computer accessible medium, according to an exemplary embodiment of the present disclosure, the exemplary procedure can iteratively merge SCCs into larger regions. The end-result of each merge operation can potentially be the elimination of some of the interface registers, thus saving area cost, and potentially increasing in launch or capture power. The exemplary regions, whose merge can eliminate a maximum number of interface registers, can be merged. Every step can result in the reduction of the number of regions by one. Acyclicity constraint, however, can still be met upon merge operations. Merging two regions from consecutive levels can preserve the acyclicity of the graph. Two regions from the same level can also be merged without introducing a cycle, yet offering no interface register savings. Every sub-procedure of the exemplary procedure can offer a partitioning solution with a particular implementation cost mostly driven by the total number of interface registers and by power reduction. The sub-procedure of the exemplary procedure is shown in a flow diagram of FIG. 4. The sub-procedure of the exemplary iterative merge-based partitioning procedure can resemble the min-cut problem (see, e.g., Reference 19), which can be known to be an NP-Complete problem.

Figure 4:
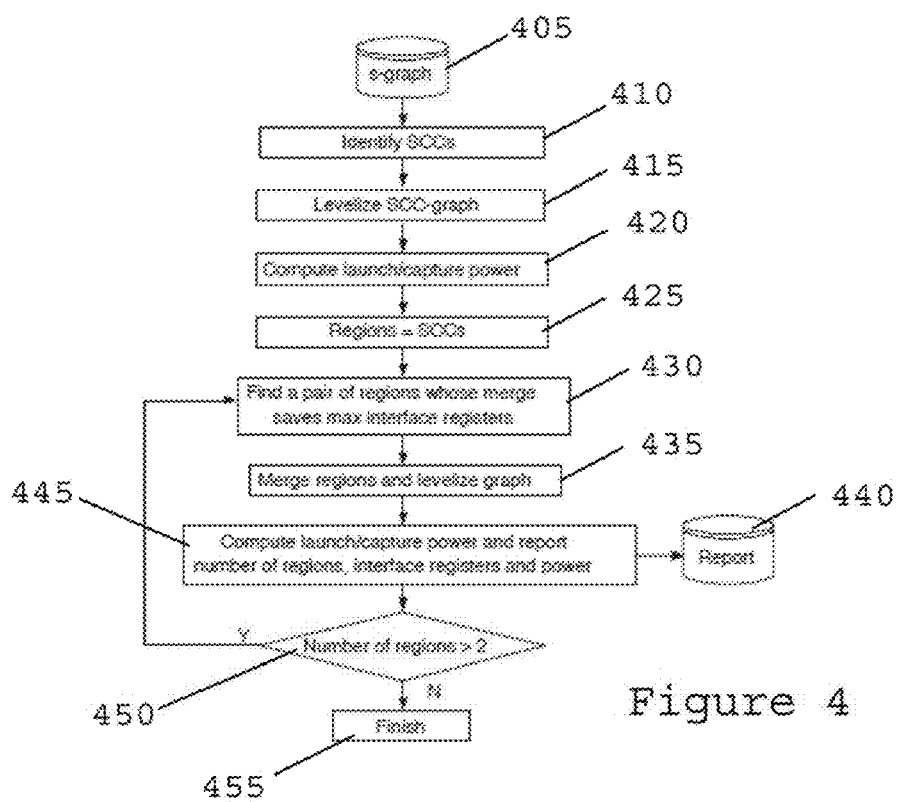
FIG. 4 is an exemplary flow diagram of an exemplary partitioning procedure according to an exemplary embodiment of the present disclosure.

FIG. 4 is an exemplary flow diagram of an exemplary partitioning procedure according to an exemplary embodiment of the present disclosure. First, the SCCs of the s-graph 405 can be identified (e.g., procedure 410) and levelized (e.g., procedure 415) by using any exemplary procedure (see, e.g., Reference 18), where levels can denote the distance of an SCC to the primary inputs. Then, at procedure 420, an exemplary launch and capture power can be estimated by counting the transitions in the scan cells. Subsequently, each SCC can be treated as a region (e.g., procedure 425). The exemplary procedure can provide a solution with maximum power reduction at maximum area cost. The remainder of the procedure can be an iterative process. In each iteration, the two regions whose merge can result in the maximum saving in interface registers (e.g., procedure 430) can be merged (e.g., procedure 435), which can reduce the number of regions by one, and the new exemplary launch and power estimates can be computed by counting the transitions in the scan cells (e.g., procedure 445). In each iteration, the exemplary procedure can report the new solution to the designer 440. The iterations can be repeated until the design has at least two regions (e.g., procedure 450) and the exemplary procedure can end at procedure 455.

Exemplary Application Flow

Figure 5:
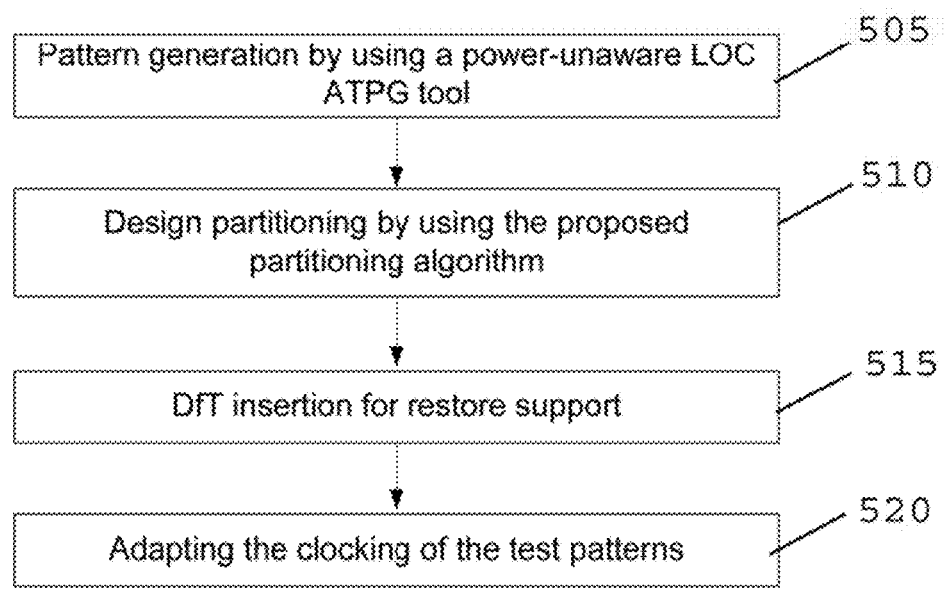
FIG. 5 is an exemplary flow diagram of a method for implementing an exemplary low-power LOC testing according to an exemplary embodiment of the present disclosure.

As shown in a flow diagram of FIG. 5, the exemplary operations can be performed so as to implement the exemplary system, method and computer accessible medium, for low-power LOC testing framework, which can be capable of applying, intact, a set of LOC patterns in a low-power manner while also capable of delivering identical test quality and pattern count. It can be seen that the proposed flow fully complies with the conventional design flow.

FIG. 5 is an exemplary flow diagram of an exemplary method for implementing an exemplary low-power LOC testing according to an exemplary embodiment of the present disclosure. At procedure 505, exemplary test patterns can be generated by using a standard ATPG tool. Then, the exemplary procedure of FIG. 4 can be applied to create the regions of the design, and identify the interface registers (e.g., procedure 510). Subsequently, the hardware structures (e.g., the structures in FIG. 3), can be inserted into the design based on the identified interface registers (e.g., procedure 515). Then, the clocking of the registers can be determined (e.g., as in FIG. 2), based on the identified regions and interface registers (e.g., procedure 520).

Exemplary Results

The exemplary system, method and computer accessible medium, according to an exemplary embodiment of the present disclosure, can implement the exemplary design partitioning technique for LOC testing, and apply these techniques on academic benchmark circuits to gauge the launch and capture power reductions that can be attained, as well as the area cost. For LOC testing, patterns can be generated by implementing a wrapper code around ATLANTA, and use a random-fill option in filling in the unspecified bits of the stimuli. Test generation can be done in a power-unaware manner, and yet the exemplary system, method and computer accessible medium can attain power reductions, while retaining fault and defect coverage intact. Additionally, the exemplary system, method and computer accessible medium, according to an exemplary embodiment of the present disclosure, can reduce launch and capture power while being able to apply a given set of patterns as is; fully reaping its low pattern count and high test quality, for which the test set can be optimized.

TABLE 1

Launch and capture power reductions (LOC testing).

| Circuit | Scan Cells | Maximum launch power reduction | | 30% launch power | 20% launch power | 10% launch power |
|---|---|---|---|---|---|---|
| | | Launch Red. (%) | Area (%) | reduction Area (%) | reduction Area (%) | reduction Area (%) |
| s9234 | 269 | 51.3 | 9.3 | 5.6 | 5.4 | 3.1 |
| s13207 | 821 | 63.1 | 13.3 | 4.2 | 2.5 | 1.5 |
| s15850 | 698 | 35.4 | 9.3 | 9.3 | 4.2 | 2.7 |

TABLE 1-continued

Launch and capture power reductions (LOC testing).

| Circuit | Scan Cells | Maximum launch power reduction | | 30% launch power reduction Area (%) | 20% launch power reduction Area (%) | 10% launch power reduction Area (%) |
|---|---|---|---|---|---|---|
| | | Launch Red. (%) | Area (%) | | | |
| s35932 | 2083 | 85.4 | 8.7 | 4.5 | 4.5 | 1.8 |
| s38417 | 1770 | 61.5 | 10.5 | 4.8 | 3.8 | 2.0 |
| s38584 | 1742 | 40.8 | 7.2 | 7.2 | 1.7 | 1.0 |
| b17 | 1549 | 35.4 | 1.7 | 1.7 | 1.7 | 1.7 |

In Table 1 above, the launch power reductions of the exemplary system, method and computer accessible medium, can be seen. Columns 3-4 provide the results of the proposed exemplary procedure tuned for maximum peak launch power reduction; the maximum reduction in peak launch power and the area cost can be seen in these two columns, respectively. Each of the subsequent three columns provides the results when a certain level of peak launch power reduction can be targeted and attained; columns 5, 6 and 7 present the area costs in attaining peak launch power reductions of 30%, 20%, and 10%, respectively.

On average, a maximum peak launch power reduction of about 53.3% can be attained at an area cost of about 8.6%; the area cost can become smaller for larger benchmark circuits. The exemplary system, method and computer accessible medium, according to an exemplary embodiment of the present disclosure, can offer less costly solutions by performing iterative merge operations, which can reduce the total number of interface registers. To attain an approximately 30% reduction in peak launch power, on average a 5.3% area cost can be expended. For launch power reductions of approximately 20% and 10%, the area cost can be about 3.7% and 2.0%, respectively. For the largest benchmark circuits, the area cost can be lower than the average area costs above, and the exemplary system, method and computer accessible medium can be used on much larger industrial designs, where the area cost can be less than approximately 0.5%. Both launch and capture power can be reduced significantly in a cost-effective manner.

The exemplary system, method and computer accessible medium can provide a DfT support in the form of load state restore in interface registers, for enabling the use of a set of patterns optimized for cost and quality as is, yet in a low power manner. With the interface registers equipped with load state restore capability, transitions can be launched multiple times within the same pattern, with the load state restored in between these test operations. Thus, the exemplary system, method and computer accessible medium, according to an exemplary embodiment of the present disclosure, can facilitate a design partitioning approach, where any given set of patterns, generated in a power-unaware manner, can be utilized to test the design regions one at a time, which can reduce both launch and capture power in a design flow compatible manner. In such a manner, test pattern count and quality of the optimized test set can be preserved, while also lowering launch/capture power, and providing a reliable and safe environment for testing.

Figure 6:
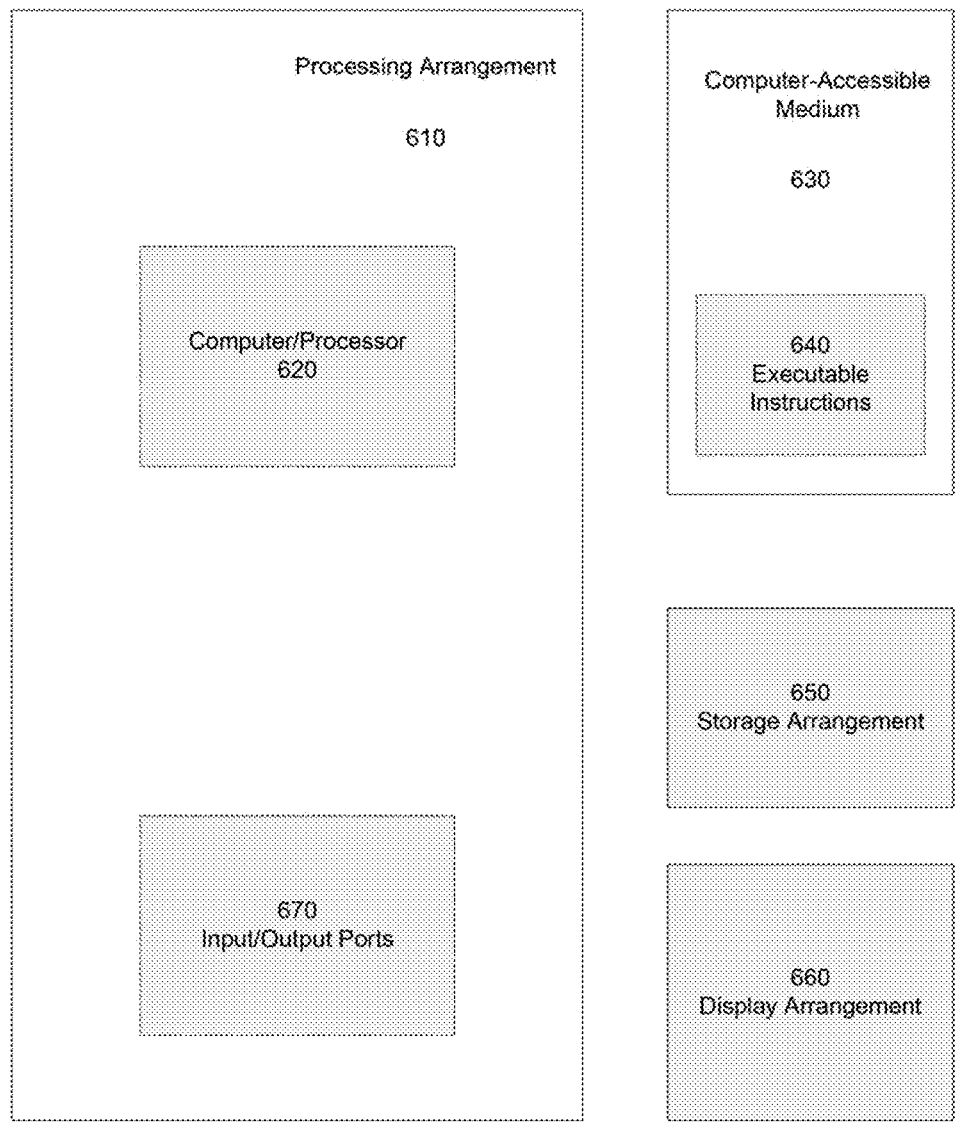
FIG. 6 is an illustration of an exemplary block diagram of an exemplary system in accordance with certain exemplary embodiments of the present disclosure.

FIG. 6 shows an exemplary block diagram of an exemplary embodiment of a system according to the present disclosure. For example, exemplary procedures in accordance with the present disclosure described herein can be performed by a processing arrangement and/or a computing arrangement 602. Such processing/computing arrangement 602 can be, for example, entirely or a part of, or include, but not limited to, a computer/processor 604 that can include, for example, one or more microprocessors, and use instructions stored on a computer-accessible medium (e.g., RAM, ROM, hard drive, or other storage device).

As shown in FIG. 6, for example, a computer-accessible medium 606 (e.g., as described herein above, a storage device such as a hard disk, floppy disk, memory stick, CD-ROM, RAM, ROM, etc., or a collection thereof) can be provided (e.g., in communication with the processing arrangement 602). The computer-accessible medium 606 can contain executable instructions 608 thereon. In addition or alternatively, a storage arrangement 610 can be provided separately from the computer-accessible medium 606, which can provide the instructions to the processing arrangement 602 to configure the processing arrangement to execute certain exemplary procedures, processes and methods, as described herein above, for example.

Further, the exemplary processing arrangement 602 can be provided with or include an input/output arrangement 614, which can include, for example, a wired network, a wireless network, the internet, an intranet, a data collection probe, a sensor, etc. As shown in FIG. 6, the exemplary processing arrangement 602 can be in communication with an exemplary display arrangement 612, which, according to certain exemplary embodiments of the present disclosure, can be a touch-screen configured for inputting information to the processing arrangement in addition to outputting information from the processing arrangement, for example. Further, the exemplary display 612 and/or a storage arrangement 610 can be used to display and/or store data in a user-accessible format and/or user-readable format.

The foregoing merely illustrates the principles of the disclosure. Various modifications and alterations to the described embodiments will be apparent to those skilled in the art in view of the teachings herein. It will thus be appreciated that those skilled in the art will be able to devise numerous systems, arrangements, and procedures which, although not explicitly shown or described herein, embody the principles of the disclosure and can be thus within the spirit and scope of the disclosure. Various different exemplary embodiments can be used together with one another, as well as interchangeably therewith, as should be understood by those having ordinary skill in the art. It should be understood that the exemplary procedures described herein can be stored on any computer accessible medium, including a hard drive, RAM, ROM, removable disks, CD-ROM, memory sticks, etc., and executed by a processing arrangement and/or computing arrangement which can be and/or include a hardware processors, microprocessor, mini, macro, mainframe, etc., including a plurality and/or combination thereof. In addition, certain terms used in the present disclosure, including the specification, drawings and claims thereof, can be used synonymously in certain instances, including, but not limited to, for example data and information. It should be understood that, while these words, and/or other words that can be synonymous to one another, can be used synonymously herein, that there can be instances when such words can be intended to not be used synonymously. Further, to the extent that the prior art knowledge has not been explicitly incorporated by reference herein above, it is explicitly incorporated herein in its entirety. All publications referenced are incorporated herein by reference in their entireties.

EXEMPLARY REFERENCES

The following references are hereby incorporated by reference in their entirety.

[1] J. Savir and S. Patil, "On broad-side delay test," IEEE Transactions on Very Large Scale Integration (VLSI) Systems, vol. 2, no. 3, pp. 368-372, 1994.
[2] J. Savir and S. Patil, "Scan-based transition test," IEEE Transactions on Computer-Aided Design of Integrated Circuits and Systems, vol. 12, no. 8, pp. 1232-1241, August 1993.
[3] P. Girard, "Survey Of Low-Power Testing Of VLSI Circuits," IEEE Design and Test, vol. 19, no. 3, pp. 82-92, 2002.
[4] P. Girard, N. Nicolici, and X. Wen, "Power-Aware Testing And Test Strategies For Low Power Devices," in Springer, 2010.
[5] J. Saxena, K. M. Butler, V. B. Jayaram, S. Kundu, N. V. Arvind, P. Sreeprakash, and M. Hachinger, "A Case Study Of IR-Drop In Structured At-Speed Testing," in International Test Conference, 2003, pp. 1098-1104.
[6] K. M. Butler, J. Saxena, T. Fryars, G. Hetherington, A. Jain, and J. Levis, "Minimizing Power Consumption In Scan Testing: Pattern Generation And DFT Techniques," in International Test Conference, 2004, pp. 355-364.
[7] K. Agarwal, S. Vooka, S. Ravi, R. Parekhji, and A. S. Gill, "Power Analysis And Reduction Techniques For Transition Fault Testing," in Asian Test Symposium, 2008, pp. 403-408.
[8] K. Chakravadhanula, V. Chickermane, B. Keller, P. Gallagher, and P. Narang, "Capture Power Reduction Using Clock Gating Aware Test Generation," in International Test Conference, 2009, pp. 1-9.
[9] Zhuo Zhang, S. M. Reddy, I. Pomeranz, J. Rajski, and B. M. Al-Hashimi, "Enhancing Delay Fault Coverage Through Low Power Segmented Scan," in European Test Symposium, May 2006, pp. 21-28.
[10] Qiang Xu, Dianwei Hu, and Dong Xiang, "Pattern-Directed Circuit Virtual Partitioning For Test Power Reduction," in International Test Conference, 2007, pp. 1-10.
[11] E. K. Moghaddam, J. Rajski, S. M. Reddy, and M. Kassab, "Atspeed Scan Test With Low Switching Activity," in VLSI Test Symposium, 2010, pp. 177-182.
[12] F. Wu, L. Dilillo, A. Bosio, P. Girard, S. Pravossoudovitch, A. Virazel, M. Tehranipoor, K. Miyase, X. Wen, and N Ahmed, "Power Reduction Through X-Filling Of Transition Fault Test Vectors For Los Testing," in International Conference on Design and Test of Integrated Systems, 2011.
[13] P. Girard, L. Guiller, C. Landrault, and S. Pravossoudovitch, "Circuit Partitioning For Low Power BIST Design With Minimized Peak Power Consumption," in Asian Test Symposium, 1999, pp. 89-94.
[14] Ho Fai Ko and N. Nicolici, "Rtl Scan Design For Skewed-Load At-Speed Test Under Power Constraints," in International Conference on Computer Design, 2006, pp. 237-242.
[15] Ho Fai Ko and N. Nicolici, "Automated Scan Chain Division For Reducing Shift And Capture Power During Broadside At-Speed Test," IEEE Transactions on Computer-Aided Design of Integrated Circuits and Systems, vol. 27, no. 11, pp. 2092-2097, 2008.
[16] Zhen Chen, Krishnendu Chakrabarty, and Dong Xiang, "Mvp: Capture-Power Reduction With Minimum-Violations Partitioning For Delay Testing," in International Conference on Computer-Aided Design, 2010, pp. 149-154.
[17] O. Sinanoglu, "Rewind-Support For Peak Capture Power Reduction In Launch-Off-Shift Testing," in Asian Test Symposium, 2011.
[18] P. M. Rosinger, B. M. Al-Hashimi, and N. Nicolici, "Scan architecture With Mutually Exclusive Scan Segment Activation for Shift-And Capture-Power Reduction," IEEE Transactions On Computer-Aided Design of Integrated Circuits and Systems, vol. 23, no. 7, pp. 1142-1153, 2004.
[19] G. Karypis et al., "Multilevel Hypergraph Partitioning: Applications in VLSI Domain," in Technical Report, Department of Computer Science, University of Minnesota, 1998.
[20] R. Sankaralingam, N. A. Touba, and B. Pouya, "Reducing power dissipation during test using scan chain disable," in VLSI Test Symposium, 2001, pp. 319-324.

What is claimed is:

1. A non-transitory computer-accessible medium having stored thereon computer-executable instructions for modifying at least one circuit, wherein, when a computer hardware arrangement executes the instructions, the computer arrangement is configured to perform procedures comprising:
dividing the at least one circuit into a plurality of regions such that each scan cell of a plurality of scan cells belongs to a single region, and the regions do not form a cycle;
levelizing the regions;
selecting a set of the scan cells of at least one first region that drive a plurality of interface registers that belong to at least one second region as at least one interface register; and
inserting at least one shadow register into the at least one interface register.

2. The non-transitory computer readable medium of claim 1, wherein the computer arrangement is further configured to shift operations to load and unload the scan cells.

3. The non-transitory computer readable medium of claim 2, wherein the computer arrangement is further configured to:
launch an operation in at least one of the at least one interface register or a second set of the scan cells; and
perform a capture operation in a third set of the scan cells.

4. The non-transitory computer readable medium of claim 3, wherein the computer arrangement is further configured to perform a restore operation in the at least one interface register by transferring data from the at least one shadow register into the at least one interface register.

5. The non-transitory computer readable medium of claim 4, wherein the computer arrangement is further configured to repeat the launch, perform and restore procedures until all scan cells have been captured at least once.

6. The non-transitory computer readable medium of claim 3, wherein the computer arrangement is further configured to perform the launch procedure and the capture procedure for each region one at a time.

7. The non-transitory computer readable medium of claim 6, wherein the computer arrangement is further configured to perform the launch procedure and the capture procedure for transitions within each region.

8. The non-transitory computer readable medium of claim 4, wherein the computer arrangement is further configured to perform the launch procedure and the capture procedure after the restoring procedure depending on a level of a region.

9. The non-transitory computer readable medium of claim 1, wherein the computer arrangement is further configured to perform a partitioning procedure to stagger launch-capture clocks of the regions.

10. The non-transitory computer readable medium of claim 9, wherein the computer arrangement is further configured to perform the partitioning procedure based on at least one constraint and at least two optimization criteria.

11. The non-transitory computer readable medium of claim 10, wherein the at least two optimization criteria includes a minimization of launch and capture power, and a minimization of the interface registers.

12. The non-transitory computer readable medium of claim 1, wherein the regions are acyclical.

13. The non-transitory computer readable medium of claim 1, wherein the computer arrangement is further configured to load a test pattern into at least one of the scan cells.

14. A method for transforming a circuit comprising:
dividing the at least one circuit into a plurality of regions such that each scan cell of a plurality of scan cells belongs to a single region, and the regions do not form a cycle;
levelizing the regions;
selecting a set of the scan cells of at least one first region that drive a plurality of interface registers that belong to at least one second region as at least one interface register; and
using a computer hardware arrangement, inserting at least one shadow register into the at least one interface register.

15. The method of claim 14, further comprising performing shifting operations to load and unload the scan cells.

16. A circuit comprising:
a plurality of levelized regions such that each scan cell of a plurality of scan cells belongs to a single region, and the regions do not form a cycle;
a set of the scan cells of at least one first region that drive a plurality of interface registers that belong to at least one second region, wherein the set of scan cells are selected as at least one interface register; and
at least one shadow register for the at least one interface register.

17. The circuit of claim 16, wherein the at least one scan cell is configured to be loaded and unloaded using a shift operations.

18. The circuit of claim 16, further comprising at least one test pattern loaded into at least on of the scan cells.

19. The method of claim 18, wherein the computer arrangement is further configured to:
launch an operation in at least one of the at least one interface register or a second set of the scan cells; and
perform a capture operation in a third set of the scan cells.

20. The method of claim 19, further comprising performing a restore operation in the at least one interface register by transferring data from the at least one shadow register into the at least one interface register.

* * * * *